US006356224B1

(12) United States Patent
Wohlfarth

(10) Patent No.: US 6,356,224 B1
(45) Date of Patent: Mar. 12, 2002

(54) ARBITRARY WAVEFORM GENERATOR HAVING PROGRAMMABLY CONFIGURABLE ARCHITECTURE

(75) Inventor: Paul Dana Wohlfarth, Vernonia, OR (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/425,276

(22) Filed: Oct. 21, 1999

(51) Int. Cl.[7] .................................................. H03M 1/66
(52) U.S. Cl. ........................................ 341/147; 327/106
(58) Field of Search ................................. 341/118, 120, 341/61, 143, 155

(56) References Cited

U.S. PATENT DOCUMENTS 5,659,466 A * 8/1997 Norris et al. .......... 364/400.01
5,668,338 A * 9/1997 Hewitt et al. ................. 84/629

* cited by examiner

*Primary Examiner*—Michael Tokar
*Assistant Examiner*—Joseph Lauture
(74) *Attorney, Agent, or Firm*—Daniel J. Bedell; Smith-Hill and Bedell

(57) ABSTRACT

An arbitrary waveform generator (AWG) for producing an analog output current signal includes a random access memory (RAM), a programmable logic device (PLD), a programmable pattern generator, several digital-to analog converters (DACS) and a current multiplexer. The RAM store data sequences representing the analog waveform to be generated. The pattern generator read addresses the RAM causing it to sequentially read out its stored data sequence to the PLD. The PLD routes selected fields of each data sequence word to one or more of the DACs in response to timing signals provided by the pattern generator. Each DAC produces an output current of magnitude determined by its input waveform and range data. The pattern generator also signals the analog multiplexer to sum currents produced by one or more selected DACs to produce the AWG output waveform. The nature of the AWG output waveform is flexibly determined by the nature of the data sequence and the frequency at which it is read out of the RAM, the manner in which the PLD routes the data sequence to the DACs, the value of the range data supplied to each DAC, and the output pattern generated by the pattern generator. The flexible AWG architecture permits the AWG to be appropriately configured for various combinations of output waveform frequency, bandwidth and resolution requirements.

22 Claims, 5 Drawing Sheets

ARBITRARY WAVEFORM GENERATOR HAVING PROGRAMMABLY CONFIGURABLE ARCHITECTURE

BACKGROUND OF THE INVENTION

1. Field of the Invention

The present invention relates in general to an arbitrary waveform generator (AWG) and in particular to an AWG having a programmably configurable architecture.

2. Description of Related Art

A typical programmable arbitrary waveform generator (AWG) employs a pattern generator (either a counter or an algorithmic pattern generator), an addressable random access memory (RAM) and a digital-to-analog converter (DAC). The RAM stores a sequence of data words representing the time varying magnitude of an analog waveform to be generated. When the pattern generator supplies an address sequence to the RAM the RAM reads out the stored waveform data sequence to the DAC. The DAC responds to each data word of the sequence by generating an analog output signal of magnitude proportional to the magnitude of the data word. The sequence of output levels produced by the DAC in response to the waveform data sequence is usually filtered to produce a smoothly varying analog waveform. When the waveform is periodic, the word sequence stored in the RAM need represent only one cycle of the waveform. The pattern generator can supply a periodic address sequence to the RAM causing the RAM to periodically read out the sequence to the DAC.

The width of the RAM and the resolution of the DAC limit the resolution with which an AWG can control its output analog signal levels. For example, an AWG capable of producing any of $2^8$ different output signal levels requires an 8-bit wide RAM and a DAC having 8-bit resolution. To increase the output signal resolution to 16 bits, we must increase the width of the RAM to 16-bits and double the resolution of the DAC to 16-bits. However, although wide, fast RAMs are relatively inexpensive, fast, high-resolution DACs are relatively costly. As we increase the resolution of an AWG we also rapidly increase its cost, mainly due to the cost of the increased DAC resolution.

An AWG can produce an output waveform having high frequency components by reading the waveform data sequence out of the RAM and supplying it to the DAC at a high rate. However since a RAM takes a finite amount time to read out a valid data word, and since a DAC takes a finite amount of time to convert the data word to an analog voltage or current, the maximum frequency of an AWG is limited by the operating speed of its RAM and DAC. It would be beneficial to provide a AWG that could produce high frequency output waveform without having to employ a high speed DAC or RAM.

A complex, wide-bandwidth analog waveform can have both high and low frequency components. The highest frequency component determines the minimum rate at which the RAM must supply data words to the DAC and the highest and lowest output signal frequency components in combination determine the minimum depth (number of available address spaces) of the RAM. For example when the highest frequency component of an output signal is 10 MHz the RAM should supply data words to the DAC at twice the 10 MHz rate (20 MHz) in order to adequately characterize the 10 MHz signal component. If the lowest frequency component of the output waveform is 20 Hz, then the RAM should be able store a data sequence capable of representing one full cycle of the 20 Hz component which lasts 0.05 seconds. A data sequence read out at a 20 MHz rate for 0.05 seconds would be 1 million words long. Thus the RAM must be able to store 1 million words every 0.05 seconds.

Thus the word depth of the AWG's RAM limits the lower end of its output signal bandwidth. When the lowest frequency component of an AWG output signal is higher than its lower limit, much of the RAM capacity is idle. For example if the DAC has a 1 megabyte RAM, we can use the AWG in an application where it must produce a signal having both 10 MHz and 20 Hz components by programming it to periodically read out its full 1 megabyte sequence to the DAC. However in an another application where the output signal component frequencies range only between 10 MHz and 200 Hz, the RAM need only store and periodically read out a 100 kilobyte sequence to the DAC; the other 900 kilobytes of memory storage is idle. It would therefore also be beneficial to provide a DAC and which could make efficient use of its RAM resources.

SUMMARY OF THE INVENTION

An arbitrary waveform generator (AWG) in accordance with the present invention produces a time varying analog output signal defined by input programming data. The AWG employs an addressable random access memory (RAM), a programmable logic device (PLD), a programmable pattern generator, several digital-to-analog converters (DACS) and a current multiplexer.

The RAM stores a sequence of data words representing the time varying current magnitude of an analog waveform to be generated. The pattern generator periodically addresses the RAM thereby causing the RAM to read out its stored waveform data sequence to the PLD. The PLD routes selected fields of each waveform data word from the memory to one or more of the DACs in response to timing signals provided by the pattern generator. Each DAC converts each of its input data fields into an output analog current signal of magnitude proportional to the magnitude of its input waveform data field in accordance with a constant of proportionality defined by range control data supplied to each DAC. The current multiplexer, under control of selection data generated by the pattern generator, sums the current signals produced by one or more selected DACs to produce the AWG output signal. That signal may be converted to a voltage and filtered in a conventional manner to produce a smoothly varying analog waveform.

The nature of the output waveform produced by the AWG depends not only on the frequency and nature of the waveform data read out of the RAM, but also on the manner in which the PLD is programmed to route that waveform data to the DACs in response to timing signal from the pattern generator, the value of the range data supplied to each DAC, and the manner in which pattern generator is programmed to provide timing to the PLD and selection signals to the current multiplexer.

The AWG architecture provides flexibility in the way RAM and DAC resources are employed allowing a user to optimize AWG configuration based on output waveform frequency and resolution requirements. For example to produce a high frequency output signal, the PLD may be programmed to route separate fields of each RAM output data word to each DAC, with the current multiplexer alternately selecting the output of each of the DACs in turn as the AWG output signal. This interleaving of DAC outputs provides a high frequency output waveform while allowing the RAM and each DAC to operate at a lower frequency.

To produce a high resolution output AWG signal, the PLD may be programmed to route separate fields of each RAM output data word to each of several DACs, with the current multiplexer summing the outputs of the DACs to produce the AWG output signal. With each DAC having a separate, appropriately adjusted operating range, the magnitude of the output signal can be controlled with a resolution that is much higher than the resolution of any one DAC.

To provide an output waveform having a wide range of frequency components, the PLD may be programmed to successively route N separate fields of each data word read out of the RAM to the same DAC with the current multiplexer set to provide only that single DAC output as the AWG output. With the data sequence delivered to the DAC at its maximum operating frequency, the AWG can produce a waveform having a high frequency component limited only by the maximum operating frequency of the DAC. The output waveform can have a low frequency competent having a period that is the product of N, the word depth of the RAM and the period of the waveform's highest frequency component. However the resolution of the waveform is limited to the resolution of the DAC.

It is accordingly an object of the invention to provide an AWG having an architecture that may be programmably configured to optimize a desired combination of output signal frequency and resolution.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 illustrates an arbitrary waveform generator (AWG) in accordance with invention in block diagram from;

DESCRIPTION OF THE PREFERRED EMBODIMENTS(S)

Figure 1:
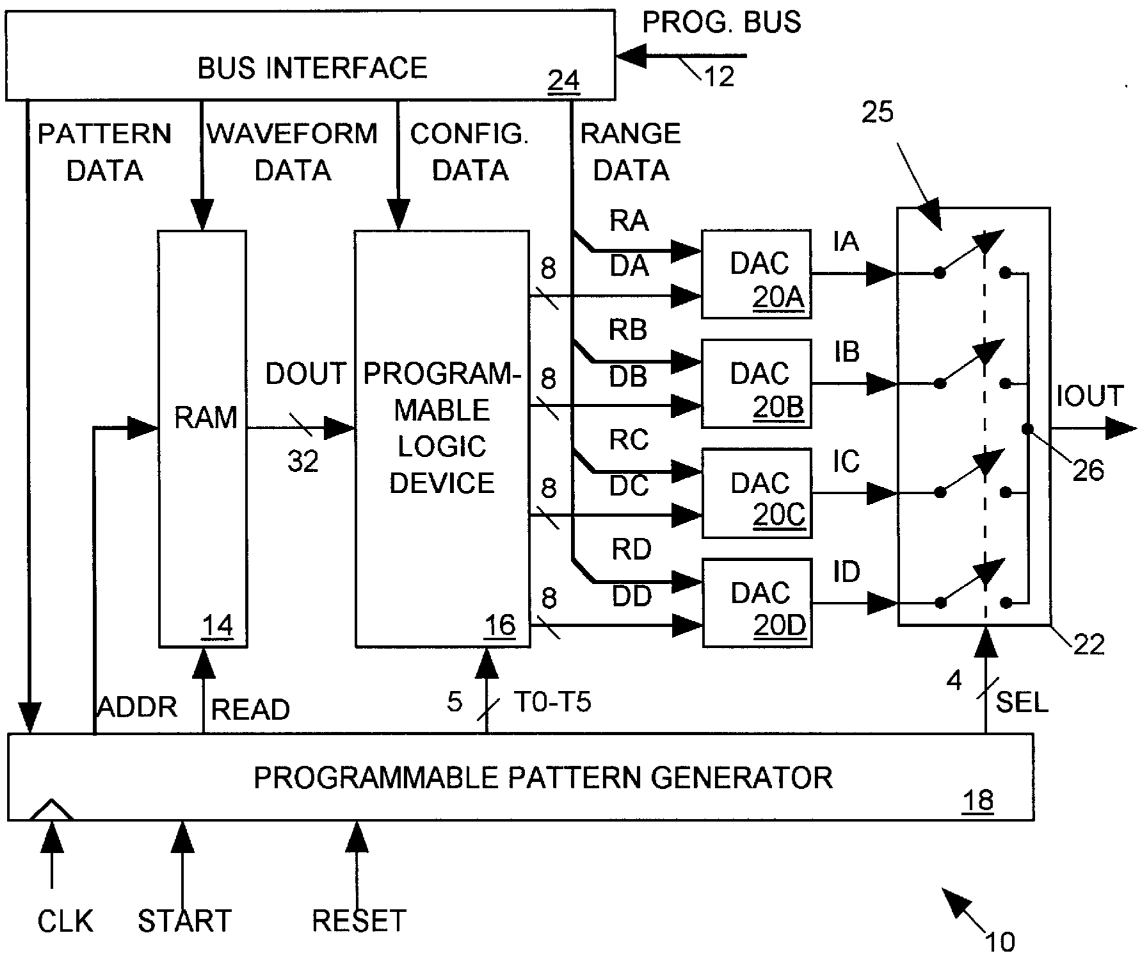

FIG. 1 illustrates in block diagram form an arbitrary waveform generator (AWG) 10 for producing an analog output signal (IOUT) defined by input data supplied via a conventional serial or parallel computer bus 12. AWG 10 includes a random access memory (RAM) 14, a programmable logic device (PLD) 16, a programmable pattern generator 18, four digital-to-analog converters (DACS) 20A–20D, a current multiplexer 22 and a conventional bus interface 24.

Bus interface 24 writes waveform data arriving on bus 12 into RAM 14. The waveform data represents the time varying current magnitude of the analog IOUT signal AWG 10 is to generate. Bus interface 24 also writes pattern data arriving on bus 12 into programmable pattern generator 18 for defining defines a sequence of output signal patterns pattern generator 18 is to generate. Bus interface 24 forwards configuration data arriving on bus 12 to PLD 16 for defining the logic PLD 16 is to carry out. Bus interface also forwards range data (RA–RD) arriving on bus 12 to each DAC 20A–20D for independently controlling the current magnitude range of each DAC's output signal IA–ID.

After bus interface 24 has forwarded the data controlling AWG operation to RAM 14, PLD 16, pattern generator 18 and DACs 20A–20D, an externally generated START signal tells AWG 10 to begin generating the output signal IOUT defined by that data. The START signal tells pattern generator 18 to start generating its sequence of output signal patterns using an input clock signal (CLK) as a timing reference. The conventional pattern generator 18 repeatedly generates its output signal pattern sequence until it receives a pulse of an externally generated RESET signal. As described below, that output signal pattern causes devices 14, 16, 20A–20D and 22 to produce the AWG output signal IOUT. The output current signal IOUT has a magnitude that changes in discrete steps, but it may be converted to a voltage and filtered by a conventional analog filter (not shown) to produce a smoothly varying analog signal. When the RESET signal tells pattern generator 18 to stop generating its output pattern sequence the AWG stops generating IOUT.

One multiple-bit data field (ADDR) of the output signal pattern produced by pattern generator 18 addresses RAM 14 and another single-bit field (READ) acts as a read enable signal for RAM 14. In response to the ADDR and READ inputs from pattern generator 18, RAM 14 sequentially reads out its stored waveform data as a sequence of 32-bit data words (IOUT) to PLD 16. PLD 16 is suitably a conventional logic array or gate array for providing programmably configurable logic between the 32-bit output IOUT of RAM 14, a 5-bit output signal pattern field T0–T5 of pattern generator 18, and the 8-bit input DA–DD of each DAC 20A–20D.

Each DAC 20A–20D responds to its 8-bit input data DA–DD by generating an output analog current signal IA–ID of magnitude proportional to the magnitude of its input data DA–DD. The range data RA–RD input to each DAC 20A–20D defines the current range of the DAC's output signal IA–ID. For example the magnitude of the output current IA of DAC 20A is proportional to the product of the magnitudes of its input range data RA and its input waveform data DA. The magnitudes of currents IB–ID of DACS 20B–20D are similarly the products of their input waveform and range data.

Another 4-bit field SEL of the pattern data produced by pattern generator 18 controls multiplexer 22. Current multiplexer 22 is an analog signal processor for processing the DAC output signals IA–ID to produce the AWG output signal IOUT. In the preferred embodiment of the invention, multiplexer 22, suitably comprising a set of four switches 25 controlled by SEL, for selectively delivering one or more of its inputs IA–ID to an output node 26 to form IOUT.

Depending on which of switches 25 are closed, the magnitude of IOUT may be zero, equal the magnitude of any one of currents IA–ID or, equal to the sum of magnitudes of any two or more currents IA–ID.

The nature of the output signal IOUT produced by AWG 10 is determined by the frequency and nature of the waveform data read out of RAM 14, the manner in which PLD 16 is programmed to process that waveform data, the value of the range data RA–RD supplied to DACs 20A–20D, and the output signal pattern produced by pattern generator 18. The following discussion illustrates ways to configure AWG 10 to optimize it for various operating characteristics.

High Frequency Configuration

Figure 2:
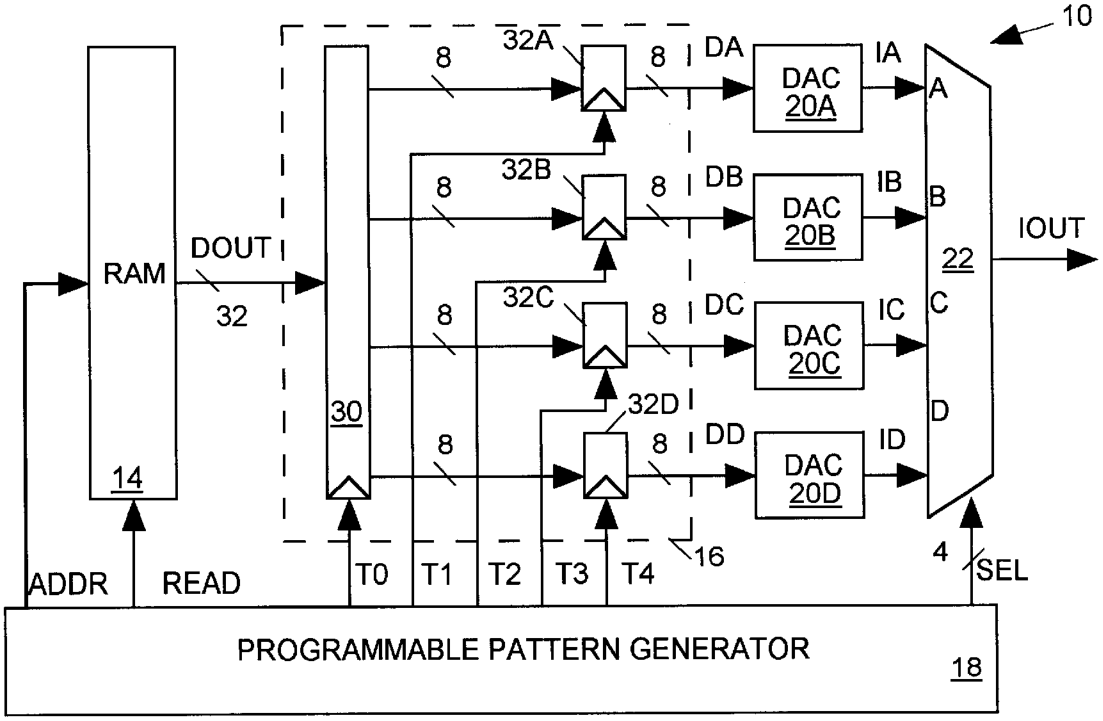
FIG. 2 illustrates the AWG of FIG. 1 detailing an example configuration of its programmable logic device (PLD) providing a high frequency AWG output signal.

FIG. 2 illustrates AWG 10 of FIG. 1 detailing an example configuration of PLD 16 optimized for producing an frequency AWG output signal IOUT having a maximally high frequency. (For simplicity bus interface 24 has been omitted from FIG. 2.)

A conventional DAC such as DACs 20A–20D needs time to stabilize its output current signal IA–AD in response to a change in the value of its input data DA–DD. Thus in a conventional AWG employing only one DAC, the maximum frequency of the IOUT signal is limited by the operating frequency of the DAC. In the AWG configuration illustrated in FIG. 2, DACs 20A–20D are each operated at their maximum frequency, but their data inputs are staggered in time and their output currents are interleaved to produce a high frequency output signal IOUT.

Figure 3:
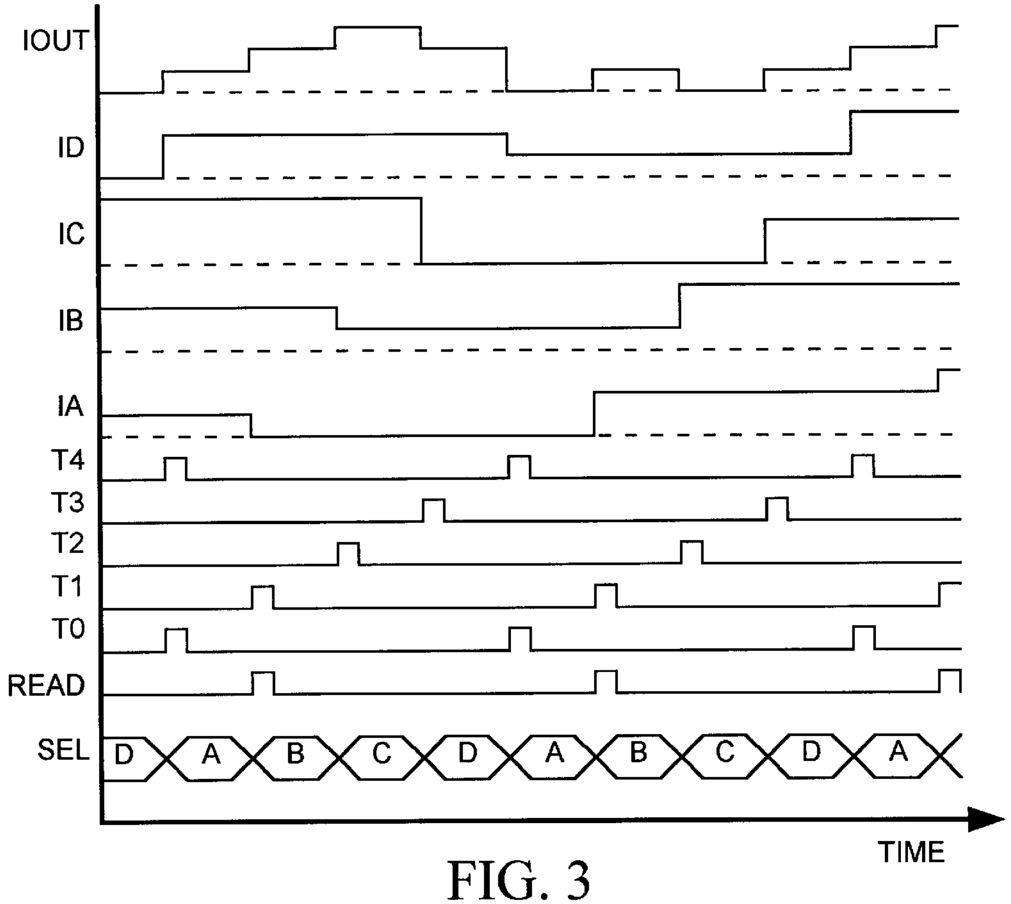
FIG. 3 is a timing diagram illustrating behavior of signals within the AWG of FIG. 2.

FIG. 3 is a timing diagram illustrating behavior of signals within AWG 10 of FIG. 2. Referring to FIGS. 2 and 3, all DACs 20A–20D have the same input range data value so they all produce the same output current magnitude when they have similar input data values. PLD 16 is programmed to implement a 32-bit latch 30 and a set of four 8-bit latches 32A–32D. Output signal TO of pattern generator 18 controls register 30 while pattern generator output signals T1–T4 separately control registers 32A–32D. Pattern generator 18 is programmed to periodically increment the value of its output ADDR field and pulse its output READ signal at the maximum operating frequency of each DAC 20A–20D. Thus RAM 14 reads out a sequence of 32-bit IOUT words to register 30 that maximum frequency.

After each READ pulse, when RAM 14 has had sufficient time to read out the currently addressed IOUT value, pattern generator 18 pulses the T0 signal causing latch 30 to pass each of four 8-bit fields of its input data word to a separate one of latches 32A–32D. Pattern generator then pulses the T1–T4 signals in succession causing latches 32A–32D to successively pass their 8-bit waveform data inputs DA–DD to DACs 20A–20D. When each DAC 20A–20D has had time to adjust its output current IA–ID to the level indicated by its input waveform data DA–DD, pattern generator 18 sets its SEL data output to signal multiplexer 22 to deliver the DAC's output current IA as the AWG's output current IOUT. The timing signals T1–T4 and selection signal SEL interleave the DAC output currents IA–ID to form IOUT such that each current IA–ID controls IOUT during ¼ of a full cycle of the READ signal.

The AWG configuration of FIG. 2 allows the IOUT signal to have a frequency that is four times higher than the frequency of the output signals IA–ID of DACs 20A–20D. Note from FIG. 3 that while each current IA–ID changes its magnitude at a frequency equal to the READ signal, the IOUT signal changes its magnitude at a frequency that is four times the READ signal frequency. Note also that RAM 14 reads out data at only ¼th the rate at which IOUT changes its value. Thus the maximum operating frequency of RAM 14 need only be ¼th of the rate at which IOUT changes its value.

While AWG 10 is illustrated as having 4 DACs 20A–20D, the architecture of AWG 10 may be expanded to include more than four DACs by adding more DACs and appropriately expanding the word width of RAM 14 and the width of the T0–T4 and SEL output fields of pattern generator 18. In general an AWG similar to that shown in FIG. 2 but having N DACs can update its output current magnitude at a frequency N times the maximum DACs operating frequency. Thus the AWG can produce high frequency output signals without having to employ an expensive, high frequency DAC. Several low frequency DACs can be much less expensive than one high frequency DAC.

The lowest output signal frequency the AWG configuration of FIG. 2 can produce is a function of the depth of RAM 14 and the frequency of its highest frequency output signal component. For example the magnitude of a 200 MHz output signal component must be magnitude updated at least a 400 MHz rate. Each of the four DACs therefore has to receive its input data at a 100 MHz rate. Suppose RAM 14 has 1 million 32-bit storage locations. Then when we periodically read a data sequence filling all 1 million storage locations out of RAM 14 at that 100 MHz rate, the sequence is repeated every 0.01 seconds. This means that the lowest frequency component that IOUT can have in the configuration of FIG. 2 when RAM 14 has 1 million storage locations and is operated at 100 MHz will be 100 Hz.

Wide Bandwidth Configuration

Figure 4:
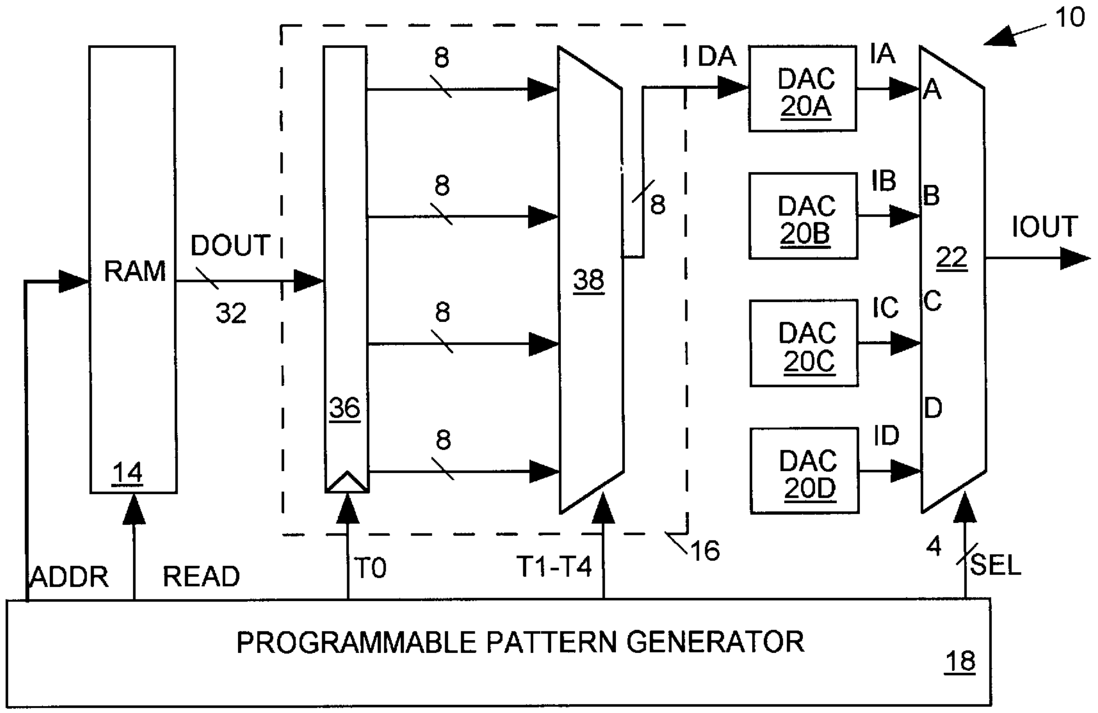
FIG. 4 illustrates the AWG of FIG. 1 detailing an example configuration of its programmable logic device (PLD) providing a low frequency AWG output signal.
Figure 5:
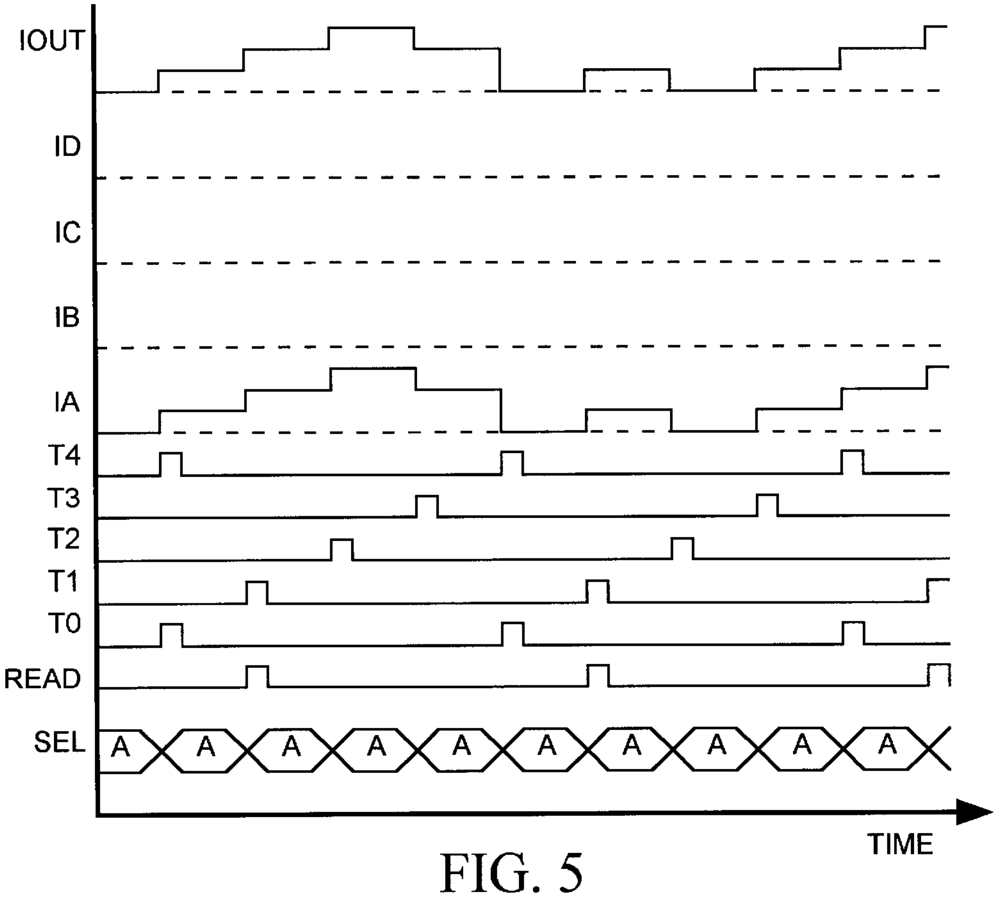
FIG. 5 is a timing diagram illustrating behavior of signals within the AWG of FIG. 4.

FIG. 4 illustrates AWG 10 of FIG. 1 detailing an example configuration of PLD 16 that is optimized for producing an output signal IOUT having a component of the lowest possible frequency when its highest signal component frequency is limited by the maximum operating frequency of a single one of DACs 20A–20B. FIG. 5 is a timing diagram illustrating behavior of signals within AWG 10 of FIG. 4. In this example only DAC 20A is used; DACs 20B–20D are idle. The configuration data input to PLD 16 has configured it to implement a 32-bit latch 36 and a multiplexer 38. Pattern generator 18 controls latch 36 with its output timing signal T0 and controls multiplexer 38 with its output timing signals T1–T4. Pattern generator 18 is programmed to provide READ and staggered T0–T4 data patterns similar to that appearing in FIG. 3. The T1–T4 pattern signals tell multiplexer 38 to successively route each of the four 8-bit fields of each IOUT word to DAC 20A. The SEL data tells multiplexer 22 to continuously deliver the IA output of DAC 20A as the output signal IOUT.

As may be seen in FIG. 5, the IOUT signal magnitude is updated at a frequency equal to four times the period of the READ signal but the maximum update rate of IOUT is equal to the maximum frequency at which DAC 20A can operate. Thus the highest IOUT output signal frequency component the AWG configuration of FIG. 4 can produce is only ¼th that of the AWG configuration of FIG. 2. However the AWG configuration of FIG. 2 produces a low frequency output signal component having a period 4 times longer than the product of the period of the READ signal and the depth of RAM 14.

High Resolution Configuration

The resolution with which a conventional AWG having a single DAC can control the magnitude of its output signal is the same as the resolution of its DAC. However the AWG 10 of FIG. 1 which uses four DACs can be configured to provide an output signal with a magnitude resolution that is much higher than the resolution of any one of its DACs 10A–20D.

Figure 6:
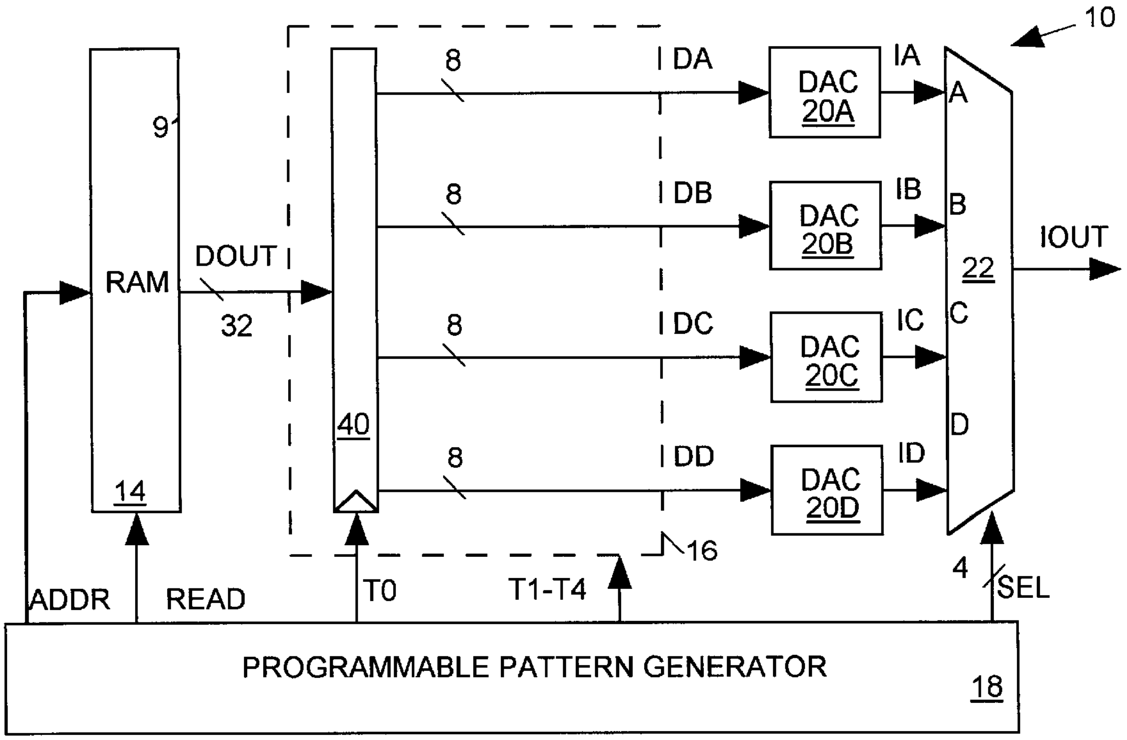
FIG. 6 illustrates the AWG of FIG. 1 detailing an example configuration of its programmable logic device (PLD) providing a high resolution AWG output signal.
Figure 7:
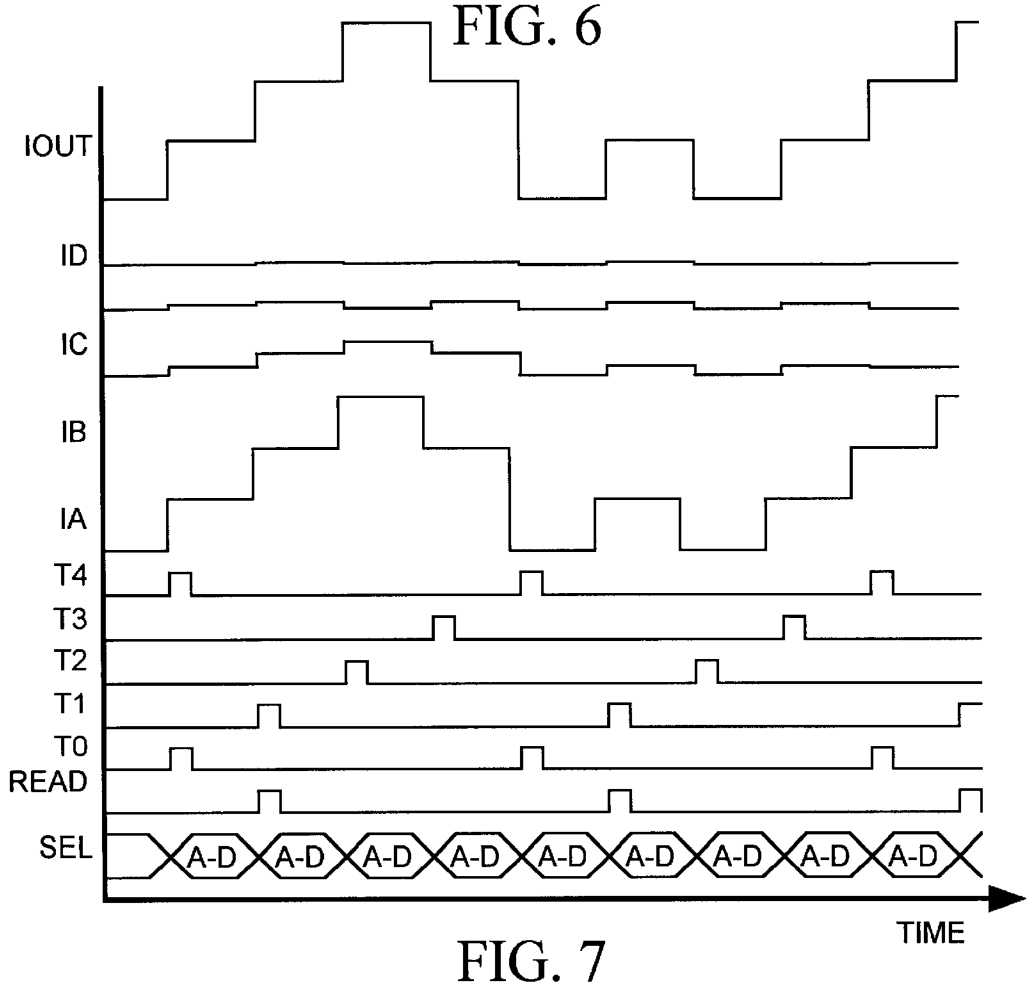
FIG. 7 is a timing diagram illustrating behavior of signals within the AWG of FIG. 6.

FIG. 6 illustrates a configuration of AWG 10 of FIG. 1 that allows the magnitude of IOUT to be adjusted with high resolution. FIG. 7 is a timing diagram illustrating the time varying behavior of signals within the AWG 10 configuration of FIG. 6. In the example of FIG. 6 PLD 16 is configured to implement a single latch 40 clocked by the T0 output of pattern generator 18. Latch 40 latches separate fields DA–DD pf RAM output IOUT onto the inputs of DACs 20A–20D. The T1–T4 outputs of pattern generator 18 are not used. The RANGE data inputs to DACs 20A–20D configures them for different output signal ranges with DAC 20A having the widest output signal current range and DAC 20D having the smallest output signal current range.

As AWG 10 produces its output signal IOUT, pattern generator 18 periodically updates the RAM 14 address and pulses the READ signal with a frequency equal to the desired rate at which the IOUT signal magnitude is to be updated. Pattern generator 18 generates a T0 signal pulse with enough delay after each READ signal pulse to allow RAM 14 sufficient time to produce a valid IOUT word. After latch 40 latches each IOUT word, all DACs 20A–20D concurrently update their current outputs IA–ID. Pattern generator continuously sets its SEL signal output so that multiplexer 22 always sums all DAC output currents IA–ID to produce the IOUT signal. The output signal IA magnitude can have a range extending from 0 to the sum of the maximum values of the output currents IA–ID of all DACs 20A–20D. Thus the full range of the output current magnitude is somewhat wider than the range of IA, the output of the DAC 20A having the widest range. However magnitude of the IOUT signal is controlled with the same resolution as the DAC 20D having the narrowest output signal range. Thus for example when the range of DAC 20A is 0 to 100 mA and the range of DAC 20D is 0–1 nA, then the resolution of IOUT is 1 nA/$2^8$. This is equivalent to controlling IOUT with about 20-bit resolution.

Thus the AWG 10 configuration of FIG. 6 can control its output waveform IOUT with a magnitude resolution that is much higher than the resolution with which it can control the output resolution of any one of DACs 20A–20D. Of course in doing so, the configuration of FIG. 6 gives up its capability to produce high frequency signal, since DACs 20A–20D must operate concurrently rather than in interleaved fashion as in the configuration of FIG. 2. Also the high resolution AWG 10 configuration of FIG. 6 cannot be operated the wide bandwidth of the AWG configuration of FIG. 4 since more of the data resources of RAM 14 need to be used for output signal magnitude.

Other Configurations

While AWG 10 configurations for high frequency, wide bandwidth and high resolutions operation have been described, it should be apparent that AWG 10 of FIG. 10 can be configured to optimize circuit operation for various combinations of desired output signal frequency, bandwidth and resolution. For example a compromise between high frequency and high resolution operation can be had by configuring AWG to time interleave the sum of currents of DACs 20A and 20B with the sum of currents of DACs 20C and 20D. In such configuration, DACs 20A and 20C would have be set to provide similarly wide output current ranges and DACs 20B and 20D would have similarly low output current ranges. When AWG 10 is expanded to include a large number of DACs and proportionately wider RAM 14, the flexibility with which the AWG can be configured increases, thereby increasing the latitude with which we can finely adjust tradeoffs between output frequency, bandwidth and resolution.

AWG With Dynamic DAC Range Control

Figure 8:
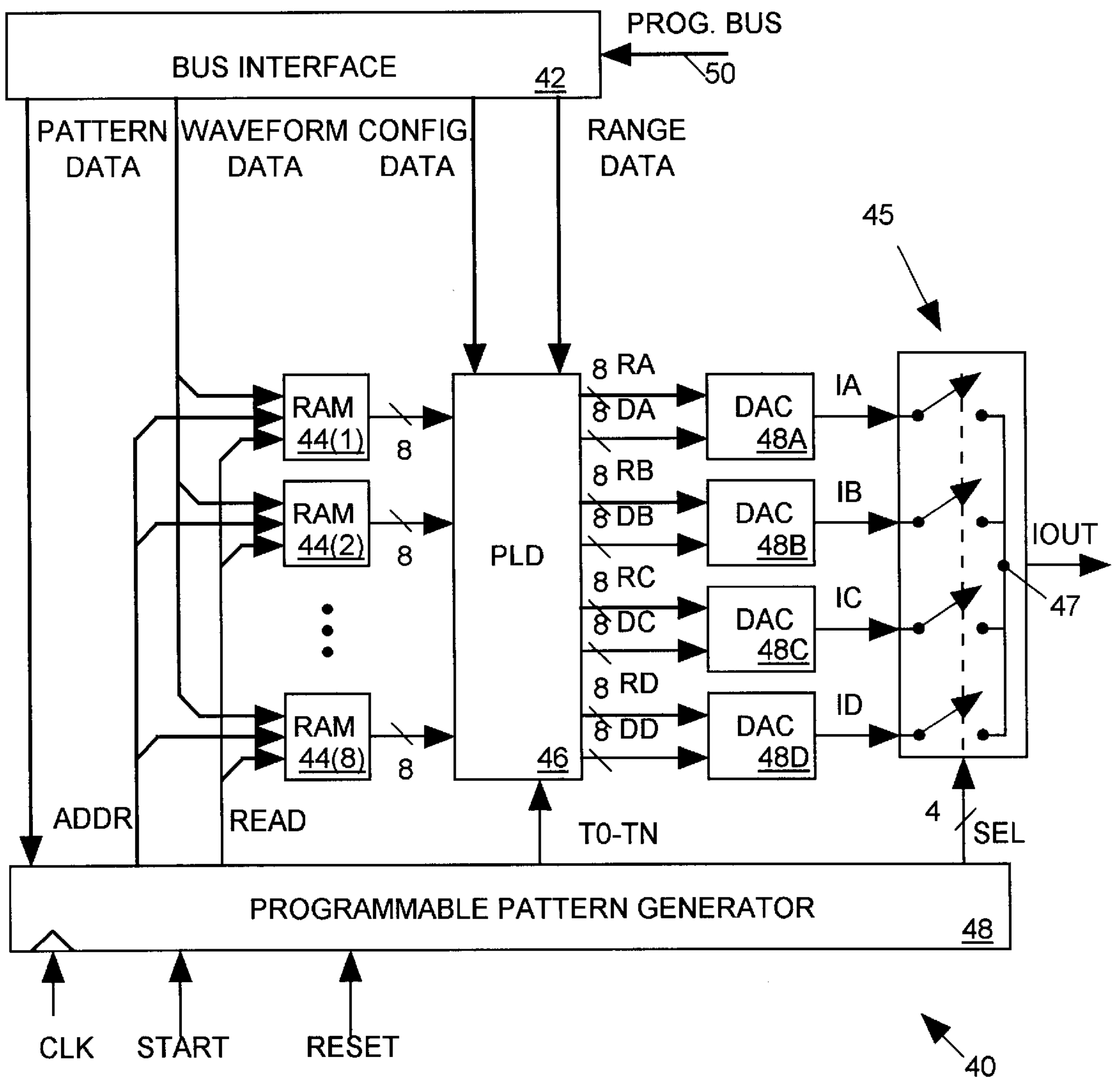
FIG. 8 illustrates in block diagram form an alternative embodiment of the arbitrary waveform generator in accordance with invention.

FIG. 8 illustrates an AWG 40 in accordance with an alternative embodiment of the invention that is similar to AWG 10 of FIG. 10 in many respects. However instead of one waveform data RAM 14 producing a 32-bit output word, AWG 40 employs a set of N RAMS, each producing an 8-bit output word. A PLD 46 configured by configuration data from a bus interface 42 selectively routes the N 8-bit RAM output data as range control data (RA–RD) or waveform data (DA–DD) inputs to a set of four DACs 48A–48D. PLD 46 may alternatively route range data stored in registers of bus interface 42 as range data RA–RD inputs to DACs 48A–48D. Each DAC 48A–48D produces an output current IA–ID of magnitude proportional to a product of magnitudes of its input range and waveform data. A set of switches 45 selectively apply one or more of currents IA–ID to an output node 47. Thus the output signal IOUT of AWG 40 appearing at node 47 is the sum of one or more DAC output currents IA–ID. A programmable pattern generator 48 independently addresses and read enables each of RAMs 44(1)–44(8), supplies timing signals T0–TN for controlling timing of routing of data through PLD 46 and provides selecting control signals (SEL) for controlling switches 46. In addition to providing range data received on a bus 50 to PLD 46, bus interface 42 also supplies pattern data received on bus 50 input to pattern generator 48, loads waveform and/or range data received on bus 50 into RAMS 44(1)–44(8), and supplies configuration data received on bus 50 to PLD 46 for controlling the manner in which it processes and routes the RAM output data.

Since RAMs 44(1)–44(4) can act in concert to supply a 32-bit waveform data word sequence to PLD 46, AWG 40 can be configured to operate in any mode of which AWG 10 is capable. However since RAMs 44(1)–44(8) can be read addressed at different frequencies, DACs 20A–20D can receive their input waveform data DA–DD at differing frequencies and phases. Thus, for example if IOUT is to be a sum of a high and a low frequency sine wave signals, RAMs 44(1) and 44(2) can be programmed to read out data sequences that vary as sine waves with RAM 44(1) read accessed at the high frequency rate while RAM 44(2) is read accessed at the lower frequency rate. PLD 46 can be configured to route the output of RAM 44(1) to DAC 48A and to route the output of RAM 44(2) to DAC 48B. Switches 45 connect IA and IB only to node 47.

The architecture of AWG 40 also allows the AWG to produce an IOUT signal of magnitude proportional to the product of two signal components having differing frequencies. For example waveform data defining the behavior of one signal component may be stored in RAM 44(1) and routed through PLD 46 to the data input DA of DAC 48. Waveform data defining the behavior of the other signal component may be loaded into RAM 44(2) and routed through PLD 46 to the range input RA of DAC 48A. Switches 46 are set to route only DAC 48A output current IA to node 47. Pattern generator 48 is programmed to address RAMs 44(1) and 44(2) at appropriately differing frequencies.

In general, an AWG similar to AWG 40 of FIG. 8 but having N DACs 48 and 2N RAMS 44 can produce an output signal that is a combination sums and products of up to 2N signal components having differing frequencies. The pattern data written into pattern generator 48 controls the phase and frequency of each signal component, and the data stored in each RAM 44 defines the shape of a separate one of the 8 components. The configuration data supplied to PLD 46 and the selection control data input to switches 46 controls the manner in which the signal components are combined.

While the foregoing specification has described preferred embodiment(s) of the present invention, many modifications to the preferred embodiment may be made without departing from the invention in its broader aspects. For example, as discussed above, the AWG of FIG. 10 can be expanded by adding more DACs and suitably increasing the width of RAM 14 and the width of the T0–T5 and SEL data fields produced by pattern generator 18. Pattern generator 18 may be any of several types of well-known programmable pattern generators. DACs 20A–20D which produce output currents could be replaced with DACs that produce output voltages. In such case multiplexer 26 would be replaced with an analog signal processor capable of selectively summing voltage inputs rather than current inputs. The AWG may be fitted with conventional filter circuits for smoothing the output signal. RAM 14 may be replaced with a ROM or a programmable pattern generator, or may be implemented by several RAMs operating in parallel. The appended claims therefore are intended to cover all such modifications as fall within the true scope and spirit of the invention.

What is claimed is:

1. An arbitrary waveform generator (AWG) for producing an AWG output signal (IOUT), the AWG comprising:

a plurality of digital-to-analog converters (DACS) (20A–20D) for generating DAC output signals (IA–ID), each DAC output signal being of magnitude controlled by a waveform data field provided as input to the DAC generating it;

a memory (14) for storing and reading out a sequence of waveform data words (DOUT);

a programmable logic device (16) for processing said waveform data words read out of said memory to provide waveform data fields (DA–DD) as input to said DACs;

a pattern generator (18) for generating timing signals (T0–T4) supplied as input to said programmable logic device, and for generating control data, wherein said programmable logic device supplies each of said waveform data fields as input to said DACs in timed response to a separate one of said timing signals; and signal processing means (22) for producing said AWG output signal in response to ones of said DAC output signals selected in response to said control data.

2. The AWG in accordance with claim 1 wherein said pattern generator also generates address data (ADDR) supplied as input to said memory, and wherein said memory reads out said waveform data words in response to said address data.

3. The AWG in accordance with claim 1 wherein said pattern generator generates selection data (SEL) supplied as input to said signal processing means, wherein said signal processing means sums current magnitudes of selected ones of said DAC output signals selected by said selection data to produce said AWG output signal.

4. The AWG in accordance with claim 1 wherein said programmable logic device processes said waveform data to produce said waveform data fields in response to configuration data (CONFIG DATA) provided as input to said programmable logic device.

5. An arbitrary waveform generator (AWG) for producing an AWG output signal (IOUT), the AWG comprising:

a plurality of digital-to-analog converters (DACS) (20A–20D) for generating DAC output signals (IA–ID);

a memory (14) for storing and reading out a sequence of waveform data words (DOUT);

a programmable logic device (16) for processing said waveform data words read out of said memory to provide a separate waveform data field as input to each of said DACs; and signal processing means (22) for producing said AWG output signal in response to said DAC output signals;

wherein each of said DACs also receives input range data RA–RD), and wherein a magnitude of the DAC output signal produced by each of said DACs is a function of a magnitude of its input range data and a magnitude of the waveform data field provided as input to the DAC.

6. The AWG in accordance with claim 5 wherein said signal processing means combines current magnitudes of said DAC output signals to produce said AWG output signal.

7. The AWG in accordance with claim 6 further comprising a pattern generator for generating selection data (SEL) supplied as input to said signal processing means, wherein said signal processing means sums current magnitudes of selected ones of said DAC output signals selected by said selection data to produce said AWG output signal.

8. The AWG in accordance with claim 7 wherein said programmable logic device processes said waveform data to produce said waveform data fields in response to configuration data (CONFIG DATA) provided as input to said programmable logic device.

9. The AWG in accordance with claim 5 further comprising a pattern generator (18) for generating address data (ADDR) supplied as input to said memory, wherein said memory reads out said waveform data words in response to said address data.

10. The AWG in accordance with claim 5 further comprising a pattern generator for generating timing signals (T0–T4) supplied as input to said programmable logic device, wherein said programmable logic device supplies said waveform data fields as input to said DACs in timed response to said timing signals.

11. An arbitrary waveform generator (AWG) for producing an AWG output signal (IOUT), the AWG comprising:

a pattern generator (18) for generating an address field (ADDR) and a control field;

a plurality of digital-to-analog converters (DACS) (20A–20B) for generating DAC output signals, each DAC output signal being of magnitude controlled by a waveform data field (DA–DD) provided as input to the DAC generating it;

a memory (14) for storing and reading out a sequence of waveform data words (DOUT) in response to said address field;

a programmable logic device (16) for processing said waveform data words read out of said memory to provide said waveform data fields as input to said DACs; and signal processing means (22) for producing said AWG output signal in response to said DAC output signals and said control field;

wherein said pattern generator also generates timing signals (T0–T4) supplied as input to said programmable logic device, and wherein said programmable logic device supplies said waveform data fields as input to said DACs in timed response to said timing signals.

12. The AWG in accordance with claim 11 wherein said signal processing means sums current magnitudes of selected ones of said DAC output signals selected by said control field to produce said AWG output signal.

13. The AWG in accordance with claim 12 wherein said programmable logic device processes said waveform data to produce said waveform data fields in a manner controlled by configuration data (CONFIG DATA) provided as input to said programmable logic device.

14. The AWG in accordance with claim 11 wherein said address field (ADDR) and said control field (SEL) generated by said pattern generator are determined by pattern data provided as input to said pattern generator.

15. An arbitrary waveform generator (AWG) for producing an AWG output signal, the AWG comprising:

a plurality of digital-to-analog converters (DACS) (48A–48D) for generating DAC output signals (IA–ID), each DAC output signal being of magnitude controlled by a combination of a waveform data word input (DA–DD) and a range data word input (RA–RD) to the DAC generating it;

a plurality of memories (44), each for storing and reading out a separate sequence of data words;

a programmable logic device (46) for selectively routing said data words read out of said plurality of memories as waveform data word and range data word inputs to said plurality of DACs; and signal processing means (45) for producing said AWG output signal in response to said DAC output signals.

16. The AWG in accordance with claim 15 wherein said signal processing means combines current magnitudes of said DAC output signals to produce said AWG output signal.

17. The AWG in accordance with claim 15 further comprising a pattern generator (48) for generating separate address data input (ADDR) supplied to each of said memories, wherein each of said memories reads out its sequence of data words in response to its address data input.

18. The AWG in accordance with claim 17 wherein said pattern generator generates selection data (SEL) supplied as input to said signal processing means, and wherein said signal processing means sums current magnitudes of selected ones of said DAC output signals selected by said selection data to produce said AWG output signal.

19. The AWG in accordance with claim 15 wherein said programmable logic device selectively routes said data words read out of said plurality of memories as waveform data word and range data word inputs to said plurality of DACs in response to configuration data provided as input to said programmable logic device.

20. An arbitrary waveform generator (AWG) responsive to input configuration data, input pattern data, and a periodic clock signal for producing an AWG output signal, the AWG comprising:

a pattern generator programmed by the input pattern data for responding to the periodic clock signal by periodically generating a plurality of timing signals, addressing data, selection data and a read signal, a memory addressed by the addressing data for periodically reading out waveform data in response to the read signal;

a programmable logic device configured by the input configuration data to process said waveform data to periodically generate a plurality of waveform data fields, each waveform data field being generated in timed response to a separate one of the timing signals;

a plurality of digital-to-analog converters (DACS), each receiving a separate one of the waveform data fields as an input and producing a separate DAC output signal having a magnitude that is a function of its input waveform data field; and switch means for summing ones of the DAC output signals selected in response to the selection data to produce the AWG output signal.

21. The AWG in accordance with claim 20 further comprising means for supplying range data as another input to the DACs, wherein the DAC output signal produced by each DAC is of a magnitude that a function of the waveform data field and range data supplied as inputs to the DAC.

22. The AWG in accordance with claim 20 wherein the timing signals are of similar frequency and dissimilar phase.

* * * * *